United States Patent
Barahmand et al.

(10) Patent No.: US 6,651,200 B1
(45) Date of Patent: Nov. 18, 2003

(54) METHOD AND APPARATUS FOR ADAPTIVE CLOCKING FOR BOUNDARY SCAN TESTING AND DEVICE PROGRAMMING

(75) Inventors: Mehrdad Barahmand, Markham (CA); Saeed Taheri, Unionville (CA)

(73) Assignee: Acculogic, Inc., Markham (CA)

( * ) Notice: Subject to any disclaimer, the term of this patent is extended or adjusted under 35 U.S.C. 154(b) by 0 days.

(21) Appl. No.: 09/325,638

(22) Filed: Jun. 4, 1999

(51) Int. Cl.[7] ............................................... G01R 31/28
(52) U.S. Cl. ...................................................... 714/731
(58) Field of Search ................................ 714/727, 726, 714/724, 729, 731; 326/38; 370/428

(56) References Cited

U.S. PATENT DOCUMENTS

| | | | | |
|---|---|---|---|---|
| 5,109,190 A | * | 4/1992 | Sakashita et al. ............ | 324/158 |
| 5,706,297 A | * | 1/1998 | Jeppesen, III et al. ...... | 371/22.3 |
| 6,091,261 A | * | 7/2000 | De Lange ..................... | 326/38 |
| 6,286,118 B1 | * | 9/2001 | Churchill et al. ............ | 714/726 |
| 6,327,684 B1 | * | 12/2001 | Nadeau-Dostie et al. ... | 714/731 |

* cited by examiner

Primary Examiner—Albert Decady
Assistant Examiner—Matthew Dooley

(57) ABSTRACT

A boundary scan controller and method. The boundary scan controller generates an output clock for shifting output data to a target device as a serial stream. The boundary scan controller generates another clock for receiving a serial stream of input data from the target device. The input clock is generated after the output clock according to a predetermined delay. The predetermined delay provides a period of time for the target device to respond to the serial stream of output data. The boundary scan controller comprises a clock generator for generating a system clock, a transmit module having a transmit clock generator and an output data register, a receive module having a receive clock generator and an input data register, and a state machine controller. The receive module includes a delay counter for generating a delay between the transmit and receive data clocks.

8 Claims, 3 Drawing Sheets

METHOD AND APPARATUS FOR ADAPTIVE CLOCKING FOR BOUNDARY SCAN TESTING AND DEVICE PROGRAMMING

FIELD OF THE INVENTION

This invention relates to the boundary scan test techniques and more particularly to a clocking technique for boundary scan testing and device programming.

BACKGROUND OF THE INVENTION

Boundary Scan Test is a technique which was originally developed to assist in the testing of printed circuit boards. The boundary scan technique allows a board to be tested without requiring the installation of test pads for conducting the testing.

The Boundary Scan Test protocol was formalized under IEEE Standard 1149.1 in 1990. Since the adoption of the IEEE Std. 1149.1, the Boundary Scan Test technique has proliferated electronics manufacturing and the application of boundary scan techniques has expanded beyond mere interconnect testing for printed circuit boards. Today, boundary scan is being used for microprocessor bus-emulation, In-System Programming (ISP) of custom programmable logic devices (CPLD's) and Flash memory devices, functional testing of ASIC's, and non-scannable device clusters.

Typically boundary scan testing requires long test vectors. Since the boundary scan technique is highly serial and sequential, this results in increased test execution times. The ability of the controller to shift data through the scan chain at high frequencies depends on the delay caused by buffers and drivers and the distance between the target device and scan controller. This means that the longer the path delay, the slower the TCK clock rate. In the prior art systems, operation at reasonable TCK clock rates (5–10 MHz) has been achieved by keeping the distance to within 2–3 inches (5–8 cms) and eliminating any buffering. In some cases, the use of special pods has been required. Since boundary scan systems are often used in manufacturing environments, constraining the distance and/or using special pods is usually impractical.

In view of these deficiencies with prior art boundary scan systems, there remains a need for a boundary scan technique which does not suffer from these shortcomings.

BRIEF SUMMARY OF THE INVENTION

The present invention provides a boundary scan method and system which includes adaptive clocking techniques that compensate for path delays. The adaptive clocking techniques are suitable for both test applications and In-System Programming applications.

Advantageously, the adaptive clocking techniques according to the present invention allow a boundary scan test bus controller to operate at the maximum TCK clock rate supported by target devices. Since the effect of path delay is eliminated by the bus controller, it is no longer necessary to keep the programming system close to the target device or mandate the use of special pods.

In addition, the adaptive clocking techniques according to the present invention eliminate the principle cause of instability in testing and programming of ISP's.

In a first aspect, the present invention provides a boundary scan controller for scanning a target device, said boundary scan controller comprising: (a) a clock generator for generating a system clock; (b) a transmit module including, (i) a transmit clock generator for generating a transmit clock, said transmit clock being derived from said system clock; (ii) an output data register for storing an output data stream, said output data register having an output coupled to the target device and including means responsive to said transmit clock for shifting said output data stream to the target device; (c) a receive module having, (i) a receive clock generator for generating a receive clock, said receive clock being derived from said system clock and including a delay counter for delaying the running of said receive clock so that said receive clock starts running after said transmit clock; (ii) an input data register for storing data, said input data register having an input coupled to the target device and including means responsive to said receive clock for shifting in an incoming stream of data from the target device; (d) a state machine controller for controlling the operation of said transmit module and said receive module for performing a boundary scan of the target device.

In another aspect, the present invention provides a method for performing a boundary scan on a target device, said method comprising the steps of: (a) generating an output clock for outputting data to the target device; (b) shifting a serial stream of output data on said output clock to said target device; (c) generating an input clock after a predetermined delay for receiving a serial stream of incoming data from the target device; (d) wherein said predetermined delay provides a period of time for the target device to respond to said serial stream of output data.

BRIEF DESCRIPTION OF THE DRAWINGS

Reference will now be made to the accompanying drawings which show, by way of example, a preferred embodiment of the present invention, and in which.

DETAILED DESCRIPTION OF THE PREFERRED EMBODIMENT

Figure 1:
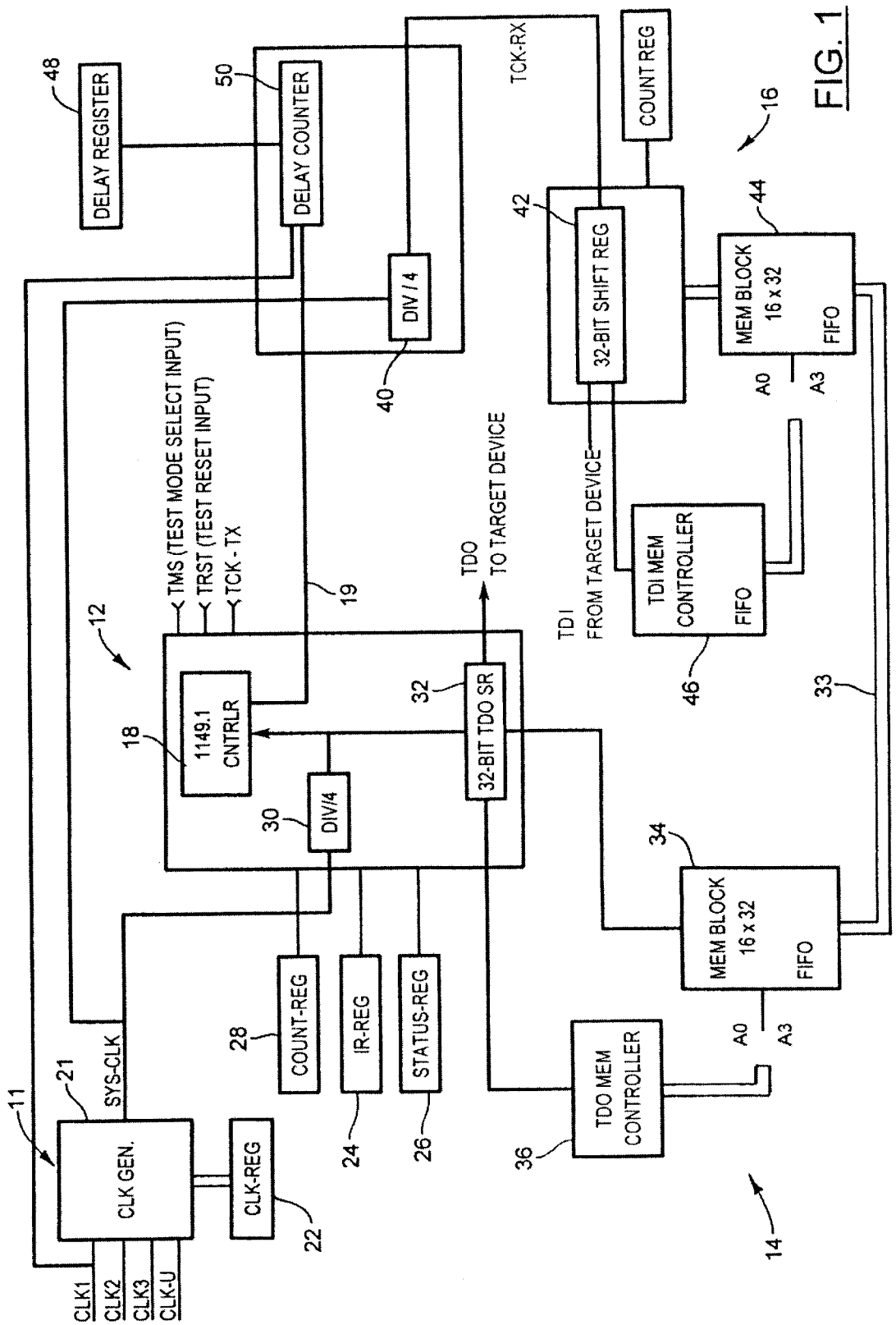
FIG. 1 is a block diagram of a boundary scan device according to the present invention.

Reference is first made to FIG. 1 which shows a boundary scan device according to the present invention and denoted generally by reference 10. In the context of the present description, the boundary scan device 10 is described as a boundary scan controller for a personal computer based, i.e. "plug&play", test and programming system.

As shown in FIG. 1, the boundary test controller 10 comprises a clock module 11 and a bus controller 12. The bus controller 12 comprises a transmit module 14 and a receive module 16. The transmit module 14 outputs test data (TDO), i.e. a serial test vector, to a target device (not shown) on a transmit clock TCK-TX (FIG. 2) as will be described in more detail below. The receive module 16 shifts in test data (TDI) from the target device on a receive clock TCK-RX (FIG. 2) as will also be described in more detail below.

The clock module 11 generates a system clock SYS-CLK which is utilized by the bus controller 12 to generate the transmit test clock TCK-TX and the receive test clock TCK-RX. The clock module 11 includes a clock generator circuit 21 and a clock register 22. The clock generator circuit 21 comprises circuitry for generating under program control the system clock SYS-CLK from oscillator clock inputs CLK1, CLK2, CLK3, and CLK-U. The clock generator 21 is programmable through the clock register 22. The user determines the frequency for the TCK rate and the SYS-CLK frequency is automatically calculated from TCK.

In the present embodiment, the oscillator clock input CLK1 is at 100 MHz, the oscillator clock input CLK2 is at 80 MHz, and the oscillator clock input CLK3 is 66 MHz. Using these oscillator inputs, the clock module 21 generates the user specified frequency for the system clock SYS-CLK by dividing down the input oscillator frequencies. For example, if the user specifies a frequency of 50 MHz for the system clock SYS-CLK, then the clock module 21 divides the oscillator clock input CLK1 by 2 to generate a 50 MHz system clock SYS-CLK. The oscillator clock input CLK-U is provided for a fourth oscillator circuit for generating a system clock SYS-CLK which cannot be derived from the existing oscillator input frequencies.

The bus controller 12 utilizes the clock register 22 to set the desired user frequency for the output test clock TCK. For example, if a frequency of 25 MHz is desired for the output clock TCK, the user specifies 25, and the application program interface (API) determines the desired value for the clock register 22, i.e. CLK-REG, and writes to the register 22. The circuitry in the clock module 11 then generates the required frequency for the system clock SYS-CLK to produce the output clock TCK.

As shown in FIG. 1, the bus controller 12 comprises the transmit module 14 and the receive module 16. The transmit module 14 controls the transmission of output test data TDO from the bus controller 12 to the target device (not shown). The receive module 16, on the other hand, controls reception of the input test data TDI from the target device. It is a feature that the transmit module 14 and the receive module 16 operate independently from each other and as such facilitate the adaptive clocking techniques according to the present invention. As will be described in more detail, this arrangement eliminates the effects of the pipeline delay on the transmission speed, and allows the test data TDI to be shifted-in at the clock rate CLK.

Referring to FIG. 1, the bus controller 12 includes also includes a state machine controller 18. The function of the state machine controller 18 is to generate the IEEE Standard 1149.1 compliant signals. As will be understood by those skilled in the art, the IEEE Std. 1149.1 defines the relationship between various activities in the boundary scan. The state machine controller 18 is configured to provide state transitions 200 for "Shift-DR" mode 201 and "Shift-IR" mode 202 as defined according to IEEE Std. 1149.1 and reproduced in FIG. 3.

In known manner, the state machine controller 18 has inputs for a Test Mode Select control signal TMS, a Test Reset control signal TRST, and an output for the transmit test clock TCK-TX for controlling the shifting-out of the output test data TDO. As shown in FIG. 1, the state machine controller 18 includes an instruction register 24 or IR-REG, a status register 26 or STATUS-REG, and a counter register 28 or COUNT-REG.

On power-up, the bus controller 12 puts the state machine controller 18 into a Test-Logic Reset state. The state machine 18 stays in this state until an instruction is received from the instruction register 24. For example, if it is desired to change the state of the state machine 18 from Reset to Select-DR-Scan (indicated by 201 in FIG. 3), then an appropriate op-code is written to the instruction register 24. The state machine 18 executes the op-code in the instruction register 24 and moves to the Select-DR-Scan state and waits for the next instruction.

The status register 26 or STATUS-REG provides a report of the activity of the state machine 18 when performing the shifting of test data. For example, when the state machine 18 is shifting-out test data, i.e. in Shift-DR mode (FIG. 3), the output test data TDO is being shifted-out from an output data memory 34 (as described below) to the target device (not shown). The status register 26 reports completion of this activity. It will be appreciated that subsequent shifts can only happen upon completion of the current task.

The counter register 28 or COUNT-REG defines the scan chain length for the target device. The information from counter register 28 is used by the transmit module 14 and the receive module 16. The value in the counter register 28 determines the number shifts for the output test data stream TDO and the corresponding input test data stream TDI.

According to the invention, the transmit module 14 in the bus controller 12 generates its own transmit test clock TCK-TX for shifting out the output test data TDO to the target device. As shown in FIG. 1, the transmit module 14 comprises a divide-by-four register 30, an output data shift register 32, an output data memory module 34, and an output data memory controller 36. The output memory module 34 provides a block of 32×16 storage for the output test data TDO and buffers the output shift register 32. The memory controller 36 controls the transfer of data from the memory module 34 via four address lines A0, A1, A2 and A3.

Figure 2:
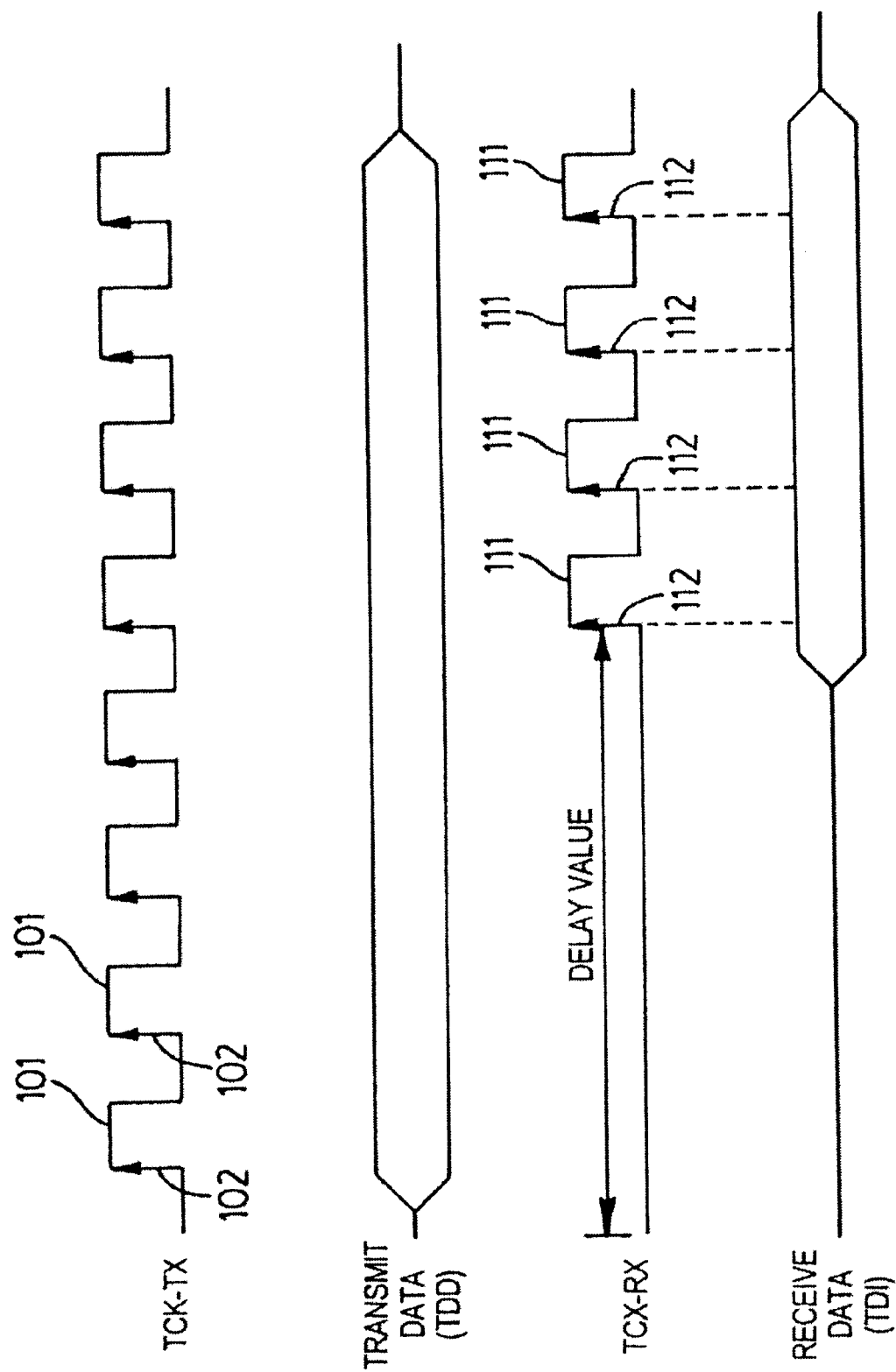
FIG. 2 is a timing diagram showing the relationship between various clock and control signals for the boundary scan device of FIG. 1.

The transmit module 14 uses the divide-by-four register 30 to generate the transmit test clock TCK-TX from the system clock SYS-CLK, i.e. the transmit clock TCK-TX is a divided down version of system clock SYS-CLK. For example, if the system clock SYS-CLK is set at 100 MHz, then the transmit test clock TCK-TX will be set at 25 MHz (i.e. ¼ of the system clock SYS-CLK). In response to the shift-out command from the bus controller 12, the output test data TDO is shifted-out to the target device (not shown) on the rising edges of pulses in the transmit test clock TCK-TX (FIG. 2).

As shown in FIG. 1, the output test data TDO is stored in the memory module 34. In response to control commands from the state machine 18, the test data TDO is shifted-out to the target device through the shift register 32 under the control of the output data memory controller 36. When the state machine controller 18 is in Shift-DR mode (FIG. 3), a double word data i.e. 32-bits, gets loaded from the output data memory module 34 into the output data shift register 32, then the state machine 18 clocks or shifts the output test data TDO in the shift register 32 at the local transmit clock TCK-TX rate. Once the last bit of the 32-bit output data word is shifted out on an edge (e.g. rising edge) of the transmit test clock TCK-TX and before the next rising edge of the transmit test clock TCK-TX, the transmit memory controller 36 loads the next double word of output test data TDO (i.e. 32 bits) into the transmit shift register 32 and the shifting-out process is repeated. It will be appreciated that this arrangement maintains a continuous serial stream of output test data TDO and thereby eliminates any delay or pausing while at the same time providing a buffer for additional output test data TDO. The output test data TDO is loaded into the memory 34 from a data bus 33 under the control of the boundary scan application program.

As described above, the receive module 16 also generates an independent receive test clock TCK-RX for shifting in the data TDI from the target device. The receive module 16 is in charge of collecting the input test data TDI from the target device.

Referring to FIG. 1, the receive module 16 comprises a divide-by-four register 40, an input data shift register 42, an input data memory module 44, an input data memory module controller 46, and a delay register 48. The input data memory module 44 and the memory module controller 46 provide a storage block and buffering between the shift register 42 and the boundary scan application program.

The divide-by-four register 40 generates the receive test clock TCK-RX by dividing the system clock SYS-CLK by four. The receive test clock TCK-RX is used to shift test data TDI from the target device into the shift register 42. Under the control of the state machine 18, the input data TDI is shifted into the shift register 42 until 32 bits (i.e. a double word) is received and then transferred to the input data memory module 44 under the control of the input data memory controller 46. The input test data TDI stored in the memory module 44 can then be transferred over the data bus 33 for further processing by the boundary scan application program.

The delay register 48 in the receive module 16 is used to set the amount of delay required to compensate for pipeline delay before the input test data TDI is shifted into the shift register 42. The delay factor is given by the user under program control and is expressed as units of system clock SYS-CLK periods. For example, a delay factor of 5 means 5 system clock SYS-CLK periods and at 100 MHz. this translates into a delay of 50 nanoseconds. For purposes of calculating the delay factor, the system clock SYS-CLK is always set to 100 MHz irrespective of the transmit test clock TCK-TX and receive test clock TCK-RX settings. It will be appreciated that this ensures that the delay factor is always the same no matter what the settings are for transmit TCK-TX and receive TCK-RX test clocks as set by the user. The delay factor stored in the delay register 48 is used to control a delay counter 50 which counts the delay period for the state machine 18 as will be described in more detail below.

Figure 3:
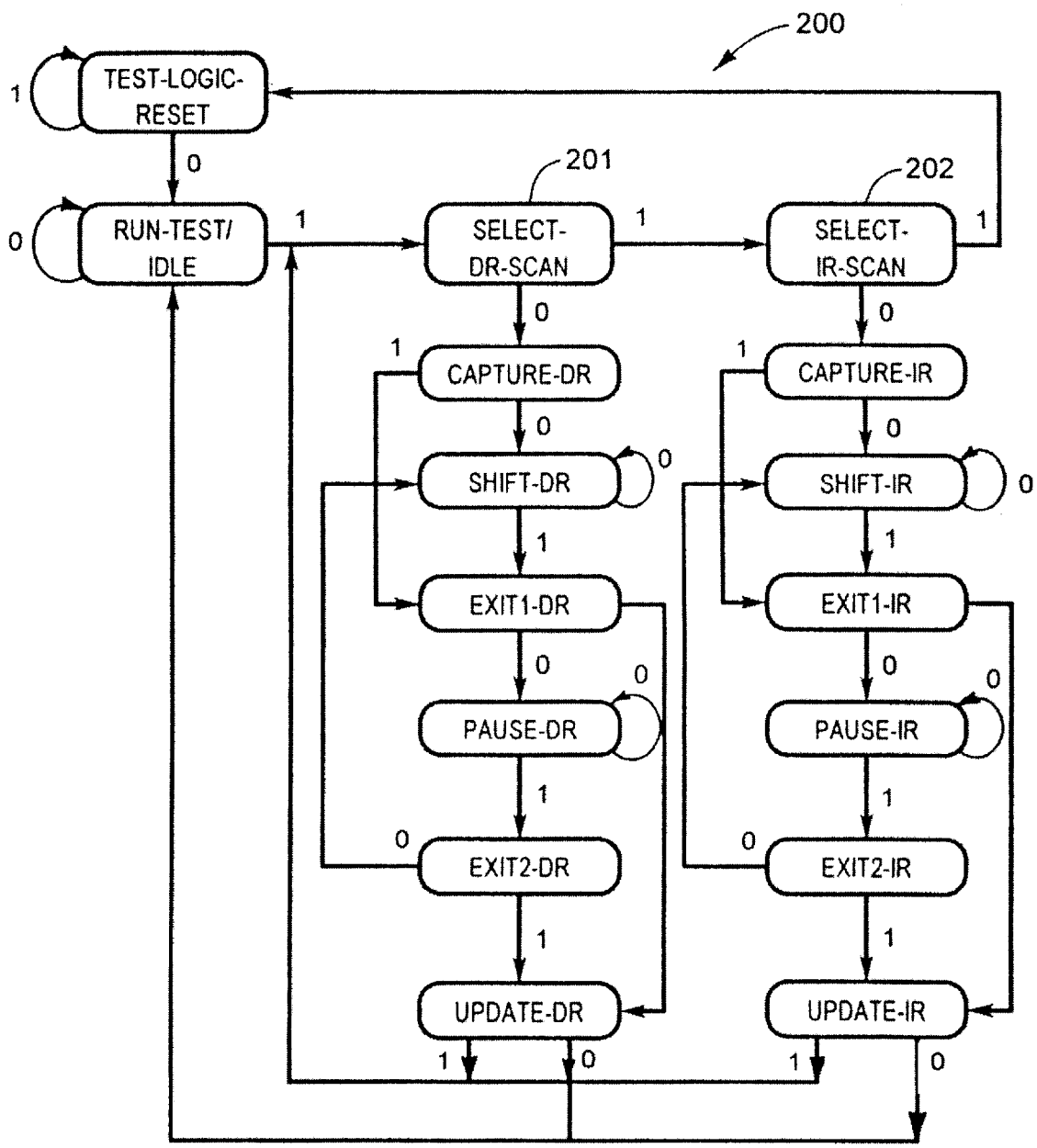
FIG. 3 is a state diagram according to IEEE Standard 1149.1 for a boundary scan state machine.

Reference is now made to FIG. 2, which shows the adaptive clocking control according to the present invention. Reference is also made to FIG. 3 which shows the state transitions for the state machine 18 according to IEEE Std. 1149.1. The adaptive clocking control works for both Shift-IR and Shift-DR mode of IEEE Standard 1149.1 operation. The state transitions for the Shift-DR mode are shown in FIG. 3 and denoted generally by reference 201, and the state transitions for the Shift-IR mode are denoted generally by reference 202, and will be familiar to the skilled person in the art.

When the state machine is in the Shift-DR mode 201 or Shift-IR mode 202 of operation, a Start-Shift line (denoted by reference 19 in FIG. 1) on the bus controller 12 is pulled high at the set-up time for the first bit of test data TDO to be shifted-out to the target device i.e. the state prior to the rising edge 102 of pulses 101 in the transmit output clock TCK-TX (as shown in FIG. 2). Pulling the Start-Shift line 19 HIGH enables the delay-counter 50. As shown in FIG. 1, the delay counter 50 is clocked directly by clock CLK1. When the value in the delay-counter 50 reaches the set value in the delay register 48, the receive or input data clock TCR-RX is enable and pulses 111 are generated based on the set TCK value. As described above, the delay register 48 sets the delay value under user control. The pulses 111 (specifically rising edges 112) of the receive test clock TCK-RX start the shifting of input test data TDI into the shift register 42. Once 32 bits of incoming test data TDO have been shifted into the register 42 on the rising edge 112 of the receive test clock TCK-RX and before the rising edge 112 of the next pulse 111 in the receive test clock TCK-RX, the input data memory controller 46 writes the current value of input test data (i.e. 32 bits) from the input shift register 42 into the memory module 44. Since clocking edges of the receive test clock TCK-RX there is no delay or pause in the reception of the incoming test data TDI.

It will be appreciated that the delay value is selected so as to allow the target device sufficient time to respond to the output test data stream TDO and any other time delays introduced as a result of the interconnection between the boundary scan device 10 and the target device. Provided there is a sufficient delay, the input test data TDI is shifted in by the receive test clock TCK-RX which runs at the TCK clock rate.

The present invention may be embodied in other specific forms without departing from the spirit or essential characteristics thereof. Certain adaptations and modifications of the invention will be obvious to those skilled in the art. Therefore, the presently discussed embodiments are considered to be illustrative and not restrictive, the scope of the invention being indicated by the appended claims rather than the foregoing description, and all changes which come within the meaning and range of equivalency of the claims are therefore intended to be embraced therein.

What is claimed is:

1. A boundary scan controller for scanning a target device, said boundary scan controller comprising:
    (a) a clock generator for generating a system clock;
    (b) a transmit module including,
        (i) a transmit clock generator for generating a transmit clock, said transmit clock being derived from said system clock;
        (ii) an output data register for storing an output data stream, said output data register having an output coupled to the target device and including logic responsive to said transmit clock for shifting said output data stream to the target device;
    (c) a receive module having,
        (i) a receive clock generator for generating a receive clock, said receive clock being derived from said system clock and including a delay counter for delaying the running of said receive clock so that said receive clock starts running after said transmit clock;
        (ii) an input data register for storing data, said input data register having an input coupled to the target device and including logic responsive to said receive clock for shifting in an incoming stream of data from the target device;
    (d) a state machine controller for controlling the operation of said transmit module and said receive module for performing a boundary scan of the target device.

2. The boundary scan controller as claimed in claim 1, wherein said delay counter includes a delay register for setting the delay value for the delay counter.

3. The boundary scan controller as claimed in claim 2, further including a memory module for storing output data intended for the target device, said memory module having an output port coupled to said output data register, an input port for loading output data, and a memory controller for controlling the transfer of output data from said memory module to said output data register.

4. The boundary scan controller as claimed in claim 3, further including another memory module for storing input data received from the target device, said memory module having an input port coupled to the input data register, an output port for outputting the received data, and a memory controller for controlling the transfer of received data from said input data register to said memory module.

5. The boundary scan controller as claimed in claim 4, wherein said state machine controller is programmed according to IEEE Standard 1149.1.

6. A method for performing a boundary scan on a target device, said method comprising the steps of:
    (a) generating an output clock for outputting data to the target device;

(b) shifting a serial stream of output data on said output clock to said target device;
(c) generating an input clock after a predetermined delay for receiving a serial stream of incoming data from the target device;
(d) wherein said predetermined delay provides a period of time for the target device to respond to said serial stream of output data.

7. The method as claimed in claim 6, wherein said predetermined delay is programmable by a user.

8. The method as claimed in claim 7, wherein said input clock has a frequency derived from a system clock and said output clock has a frequency derived from said system clock.

* * * * *